(12) United States Patent
Lu et al.

(10) Patent No.: US 11,758,797 B2
(45) Date of Patent: Sep. 12, 2023

(54) METHOD OF N-TYPE DOPING CARBON NANOTUBE

(71) Applicants: Tsinghua University, Beijing (CN); HON HAI PRECISION INDUSTRY CO., LTD., New Taipei (TW)

(72) Inventors: Gao-Tian Lu, Beijing (CN); Yang Wei, Beijing (CN); Shou-Shan Fan, Beijing (CN); Yue-Gang Zhang, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 121 days.

(21) Appl. No.: 17/505,833

(22) Filed: Oct. 20, 2021

(65) Prior Publication Data

US 2023/0022111 A1    Jan. 26, 2023

(30) Foreign Application Priority Data

Jul. 23, 2021 (CN) .......................... 202110838891.8

(51) Int. Cl.
| | |
|---|---|
| *H01L 51/50* | (2006.01) |
| *H10K 71/30* | (2023.01) |
| *H10K 85/20* | (2023.01) |

(52) U.S. Cl.
CPC ........... *H10K 71/30* (2023.02); *H10K 85/221* (2023.02)

(58) Field of Classification Search
CPC ............................ H10K 71/30; H10K 85/221
See application file for complete search history.

(56) References Cited

U.S. PATENT DOCUMENTS

| | | | |
|---|---|---|---|
| 6,723,624 | B2 | 4/2004 | Wang et al. |
| 9,773,990 | B1 | 9/2017 | Zhang et al. |
| 10,748,992 | B2 | 8/2020 | Zhang et al. |
| 2015/0034907 | A1 | 2/2015 | Hersam et al. |
| 2018/0342578 | A1 | 11/2018 | Zhang et al. |

FOREIGN PATENT DOCUMENTS

| | | |
|---|---|---|
| TW | I220269 | 8/2004 |
| TW | 201808787 | 3/2018 |
| TW | 201901763 | 1/2019 |

*Primary Examiner* — Anthony Ho
(74) *Attorney, Agent, or Firm* — ScienBiziP, P.C.

(57) ABSTRACT

A method of n-type doping a carbon nanotube includes the following steps: providing a single carbon nanotube; providing a film-like structure, wherein the film-like structure is a molybdenum disulfide film or a tungsten disulfide film; and converting at least one portion of the carbon nanotube from a p-type to an n-type by covering the carbon nanotube with the film-like structure.

19 Claims, 17 Drawing Sheets

40

50

200

METHOD OF N-TYPE DOPING CARBON NANOTUBE

FIELD

The present application relates to a method of n-type doping a carbon nanotube.

BACKGROUND

Carbon nanotubes have excellent mechanical and chemical properties, and have a length of up to one micrometer and a diameter from several nanometers to several tens of nanometers. Carbon nanotubes have excellent electrical conductivity and can be used in various electronic devices, such as electric field reflection devices, optical switches in the field of optical communications, and biological devices.

Methods for making carbon nanotubes include arc discharge, pulsed laser vaporization, chemical vapor deposition, and so on. To use carbon nanotubes in a semiconductor device, such as a complementary metal-oxide-semiconductor (CMOS) transistor, p-type and n-type MOS transistors are required. Therefore, a hole doping (p-type doping) or an electron doping (n-doping) to carbon nanotubes is required.

Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
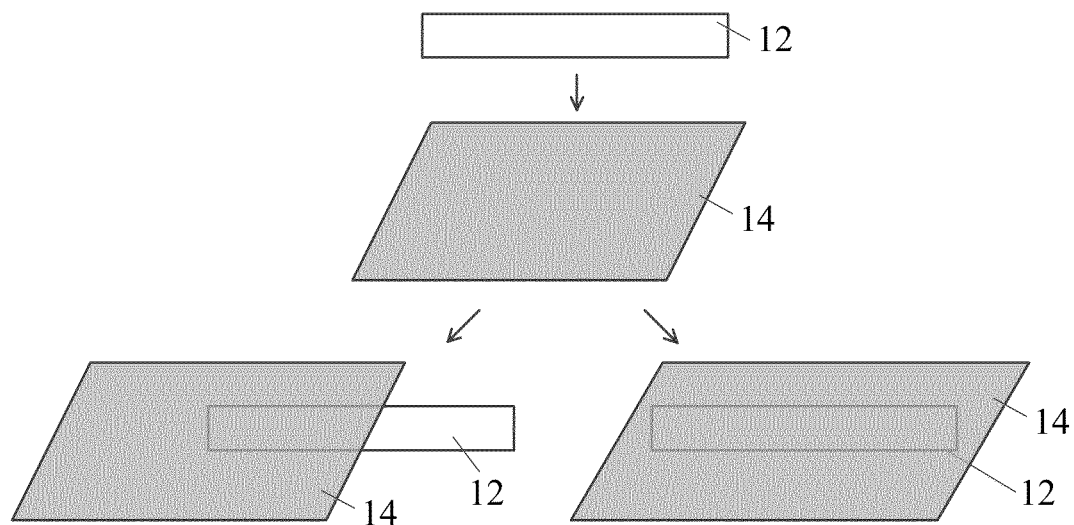
FIG. 1 shows a schematic process flow of a method of n-type doping a carbon nanotube in a first embodiment according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated better illustrate details and features. The description is not to be considered as limiting the scope of the embodiments described herein.

The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

Referring to FIG. 1, a method of n-type doping a carbon nanotube 12 in a first embodiment is provided, and the method includes the following steps:

S11, providing a single carbon nanotube 12;

S12, providing a film-like structure 14, wherein the film-like structure 14 is a molybdenum disulfide (MoS$_2$) film or a tungsten disulfide (WS$_2$) film; and S13: making at least one portion of the single carbon nanotube 12 in direct contact with the film-like structure 14.

During step S1, the carbon nanotube 12 has a one-dimensional tubular structure. The carbon nanotube 12 can be a metallic carbon nanotube or a semiconducting carbon nanotube. The carbon nanotube 12 can be a single-wall carbon nanotube, a double-wall carbon nanotube, and a multi-wall carbon nanotube. The diameter and length of the single carbon nanotube 12 are not limited. The length of the carbon nanotube 12 can be greater than 50 microns. The diameter of the single-walled carbon nanotube is in a range from 0.5 nanometers to 50 nanometers, the diameter of the double-walled carbon nanotube is in a range from 1.0 nanometer to 50 nanometers, and the diameter of the multi-walled carbon nanotube is in a range from 1.5 nanometers to 50 nanometers. In one embodiment, the carbon nanotube 12 is the single-walled carbon nanotube or the double-walled carbon nanotube.

During step S12, the molybdenum disulfide (MoS$_2$) film and the tungsten disulfide (WS$_2$) film are both two-dimensional film-like structures 14. The material of the MoS$_2$ film is MoS$_2$, and the material of the WS$_2$ film is WS$_2$. The thickness of the molybdenum disulfide (MoS$_2$) film and the tungsten disulfide (WS$_2$) film is not limited.

In one embodiment, the film-like structure 14 is the molybdenum disulfide (MoS$_2$) film, and the thickness of the MoS$_2$ film is about 4.2 nm (nanometers). In one embodiment, the thickness of the MoS$_2$ film is 4.2 nm.

Figure 2:
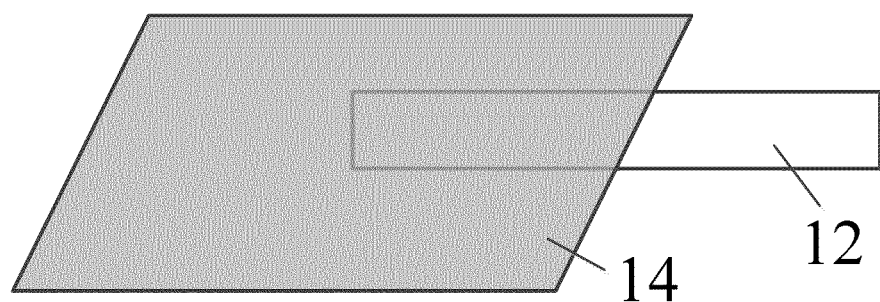
FIG. 2 shows a schematic view of a portion of a single carbon nanotube covered with a $MoS_2$ film or a $WS_2$ film in the first embodiment, wherein the single carbon nanotube is in direct contact with the $MoS_2$ film or the $WS_2$ film.
Figure 3:
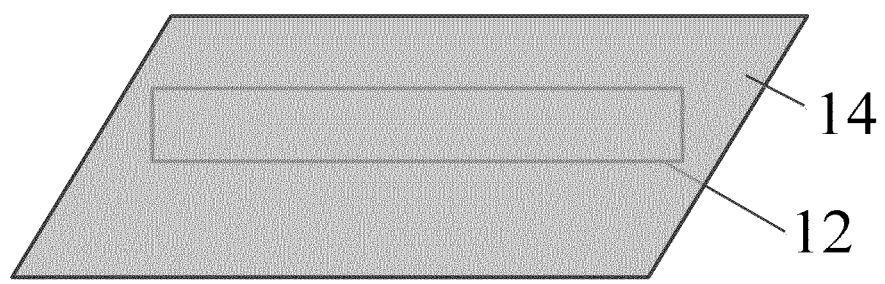
FIG. 3 shows a schematic view of entire single carbon nanotube covered with the $MoS_2$ film or the $WS_2$ film in the first embodiment, wherein the single carbon nanotube is in direct contact with the $MoS_2$ film or the $WS_2$ film.

During step S13, the carbon nanotube 12 can be completely covered by the MoS$_2$ film or the WS$_2$ film, or can be partially covered by the MoS$_2$ film or the WS$_2$ film. The MoS$_2$ film or the WS$_2$ film can cover and directly contact with a portion of the single carbon nanotube 12, while the rest of the single carbon nanotube 12 is not covered and is not directly contacted with the MoS$_2$ film or the WS$_2$ film. The MoS$_2$ film or the WS$_2$ film can also cover and directly contact with entire single carbon nanotube 12. All portions of the carbon nanotubes covered by the MoS$_2$ film or the WS$_2$ film are in direct contact with the MoS$_2$ film or the WS$_2$ film. As shown in FIG. 2, the MoS$_2$ film or the WS$_2$ film covers and is in direct contact with a portion of the single carbon nanotube 12. As shown in FIG. 3, the MoS$_2$ film or the WS$_2$ film covers and is in direct contact with the entire upper surface of the single carbon nanotube 12.

The portion of the single carbon nanotube 12 that is in direct contact with the MoS$_2$ film or the WS$_2$ film is defined as a contact portion, and the portion of the single carbon nanotube 12 that is not in direct contact with the MoS$_2$ film or the WS$_2$ film is defined as an exposed portion. The single carbon nanotube 12 consists of the contact portion and the exposed portion.

The carbon nanotube 12 is naturally a p-type semiconductor, and the contact portion of the single carbon nanotube 12 is changed from p-type doping to n-type doping. The reason is that the MoS$_2$ film or the WS$_2$ film is in direct contact with the contact portion, MoS$_2$ or WS$_2$ contributes electrons to the contact portion, electrons enter the contact portion from MoS$_2$ or WS$_2$. The exposed portion of the single carbon nanotube 12 is still p-type, because the MoS$_2$ film or the WS$_2$ film does not directly contact with the exposed portion, and the MoS$_2$ or WS$_2$ does not contribute electrons to the exposed portion and electrons cannot enter the exposed portion from MoS$_2$ or WS$_2$.

Figure 4:
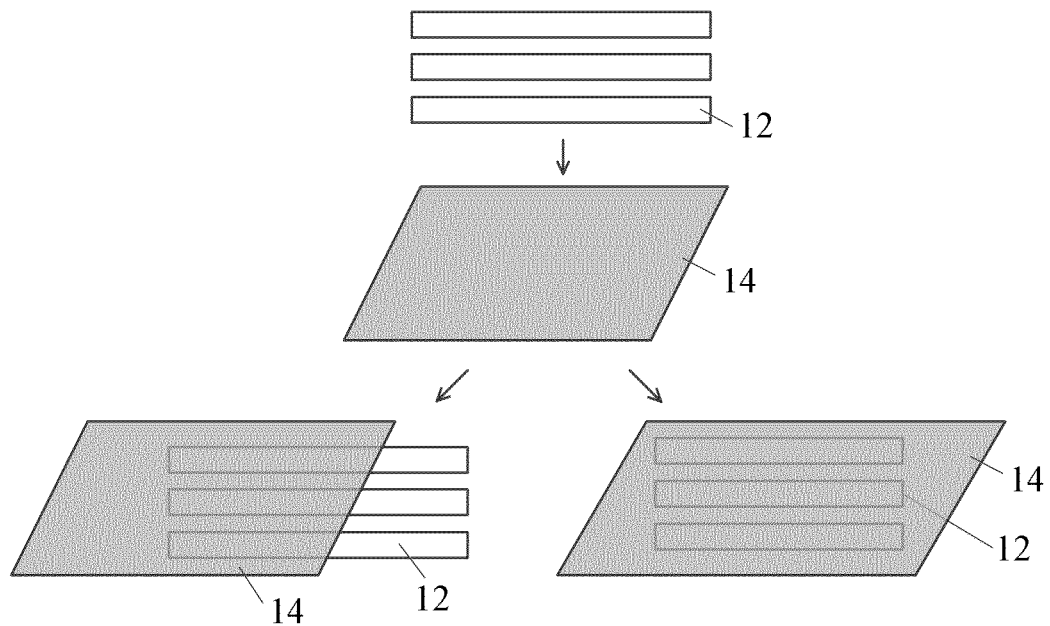
FIG. 4 shows a schematic process flow of a method of n-type doping carbon nanotubes in a second embodiment according to the present disclosure.

Referring to FIG. 4, a method of n-type doping carbon nanotubes in a second embodiment is provided, and the method includes the following steps:

S21, providing a plurality of single carbon nanotubes 12 spaced apart from each other;

S22, providing the film-like structure 14, wherein the film-like structure 14 is the molybdenum disulfide (MoS$_2$) film or the tungsten disulfide (WS$_2$) film; and S23, covering the plurality of single carbon nanotubes 12 with the MoS$_2$ film or the WS$_2$ film, wherein at least one portion of each of the plurality of single carbon nanotubes 12 is in direct contact with the MoS$_2$ film or the WS$_2$ film.

The method of n-type doping carbon nanotubes 12 in the second embodiment is similar to the method of n-type doping the carbon nanotube 12 in the first embodiment except that: in the first embodiment, the MoS$_2$ film or the WS$_2$ film covers at least one portion of one single carbon nanotube 12; in the second embodiment, the MoS$_2$ film or the WS$_2$ film simultaneously covers multiple single carbon nanotubes 12, and at least one portion of each single carbon nanotube 12 is coved by the MoS$_2$ film or the WS$_2$ film.

During step S21, the length extending directions of the plurality of single carbon nanotubes 12 are parallel to each other.

During step S23, the MoS$_2$ film or the WS$_2$ film simultaneously cover a portion of each single carbon nanotubes 12, so that a portion of each single carbon nanotube 12 is changed into the n-type from p-type. The MoS$_2$ film or the WS$_2$ film covers all of the single carbon nanotubes 12 at the same time, so that all of the single carbon nanotubes 12 are simultaneously changed into the n-type from p-type.

The n-type doping methods for carbon nanotubes 12 in the first and second embodiments have the following advantages: first, the MoS$_2$ film or the WS$_2$ film is in direct contact with a portion of the single carbon nanotube 12, which can change this portion from p-type doped to n-type doped, thereby realizing n-type doping to the single carbon nanotube 12; second, one portion of the single carbon nanotube 12 is p-type and the other portion of the single carbon nanotube 12 is n-type, thus the single carbon nanotube 12 simultaneously contains p-type and n-type; third, simultaneously n-doping to multiple single carbon nanotubes 12 can be performed; fourth, the n-doping method is simple, and the n-type doping effect is good.

A carbon nanotube composite structure in the third embodiment is provided, and the carbon nanotube composite structure is prepared by the methods in the first embodiment and the second embodiment.

Referring to FIG. 5 to FIG. 10, the first carbon nanotube composite structure 10 to the sixth carbon nanotube composite structure 60 are took as examples to specifically describe the carbon nanotube composite structure, but it is not limited by these. The carbon nanotube composite structure 10, 20, 30, 40, 50, or 60 includes at least one single carbon nanotube 12 and at least one film-like structure 14, and the film-like structure 14 is the MoS$_2$ film or the WS$_2$ film.

When the number of the single carbon nanotube 12 is one, the film-like structure 14 is located on the outer surface of the single carbon nanotube 12 and is in direct contact with a portion of the single carbon nanotube 12. One portion of the single carbon nanotube 12 is in direct contact with the film-like structure 14, and not the entire outer surface of the single carbon nanotube 12 is in direct contact with the film-like structure 14.

When the number of the single carbon nanotubes 12 is multiple, the multiple single carbon nanotubes 12 are arranged at intervals. At least one film-like structure 14 is located on the outer surface of the at least one single carbon nanotube 12, and in direct contact with a portion of each single carbon nanotube 12. In one embodiment, the length extending directions of the plurality of single carbon nanotubes 12 are spaced apart from each other and parallel to each other. A portion of each single carbon nanotube 12 is in direct contact with the film-like structure 14, and not all the outer surface of each single carbon nanotube 12 is in direct contact with the film-like structure 14.

The single carbon nanotube 12 includes at least one p-type portion and at least one n-type portion, and the p-type portion and the n-type portion are alternately arranged. The p-type portion is the exposed portion, and the n-type portion is the contact portion.

The single carbon nanotube 12 simultaneously contains p-type and n-type. The film-like structure 14 is placed on the single carbon nanotube 12, and the film-like structure 14 is in direct contact with the n-type portion. Furthermore, the outer surfaces of all of the n-type portions are in direct contact with the film-like structure 14. In one embodiment, the single carbon nanotube 12 consists of at least one p-type portion and at least one n-type portion alternately arranged, the film-like structure 14 is only located on the n-type portions and in direct contact with the n-type portions.

Figure 5:
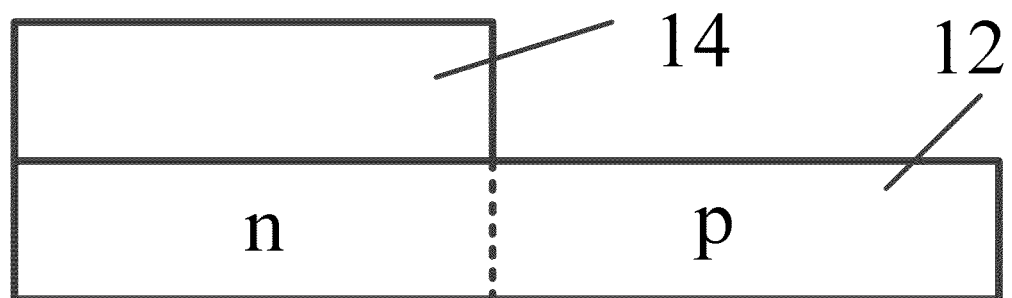
FIG. 5 shows a schematic section view of a first carbon nanotube composite structure in a third embodiment according to the present disclosure.

As shown in FIG. 5, the first carbon nanotube composite structure 10 consists of one single carbon nanotube 12 and one film-like structure 14. The single carbon nanotube 12 consists of one p-type portion and one n-type portion. The film-like structure 14 covers the n-type portion and is in direct contact with the outer surface of the n-type portion.

Figure 6:
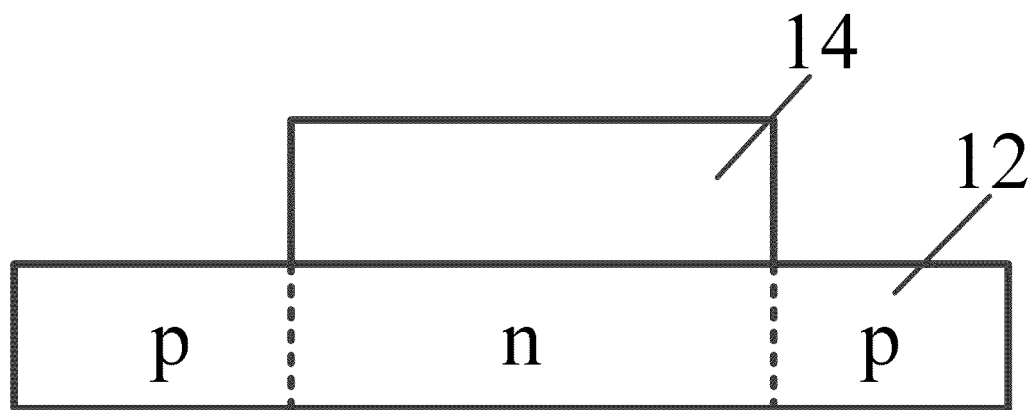
FIG. 6 shows a schematic section view of a second carbon nanotube composite structure in the third embodiment.

As shown in FIG. 6, the second carbon nanotube composite structure 20 consists of one single carbon nanotube 12 and one film-like structure 14. The single carbon nanotube 12 consists of a first p-type portion, a second p-type portion, and an n-type portion; and the n-type portion is between the first p-type portion and the second p-type portion. The single carbon nanotube 12 is a p-n-p type carbon nanotube. The film-like structure 14 covers the n-type portion and is in direct contact with the outer surface of the n-type portion.

Figure 7:
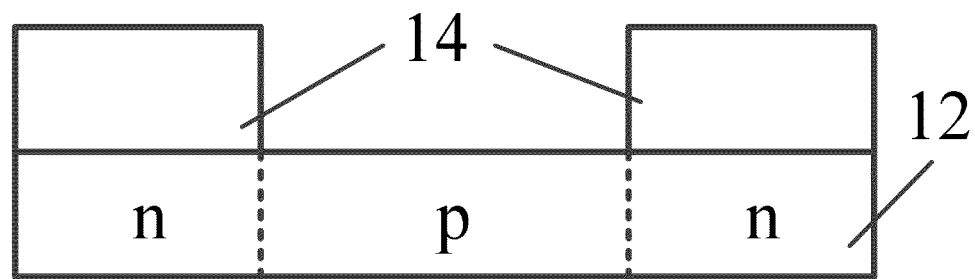
FIG. 7 shows a schematic section view of a third carbon nanotube composite structure in the third embodiment.

As shown in FIG. 7, the third carbon nanotube composite structure 30 consists of one single carbon nanotube 12 and two film-like structures 14. The single carbon nanotube 12 consists of a first n-type portion, a second n-type portion, and a p-type portion; and the p-type portion is between the first n-type portion and the second n-type portion. The single carbon nanotube 12 is an n-p-n type carbon nanotube. One film-like structure 14 covers the first n-type portion and is in direct contact with the outer surface of the first n-type portion, and the other film-like structure 14 covers the second n-type portion and is in contact with the outer surface the second n-type portion.

Figure 8:
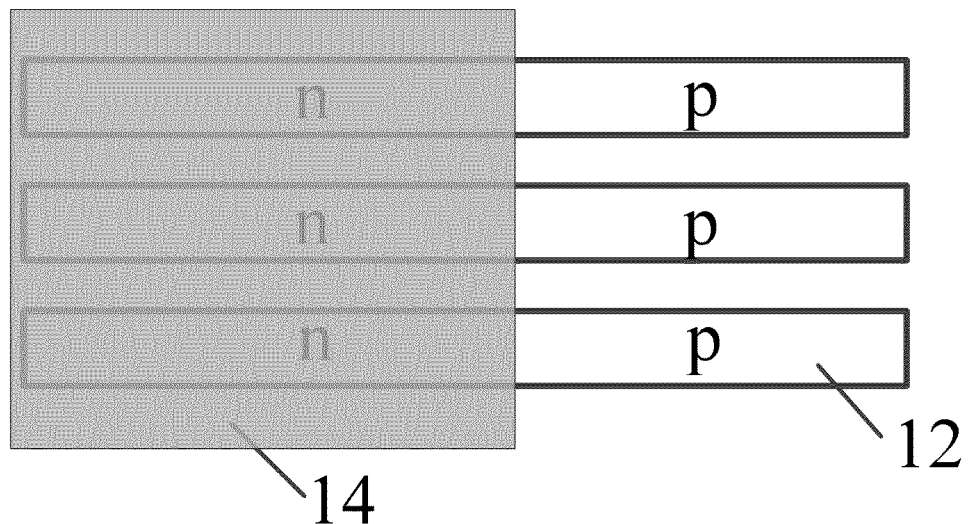
FIG. 8 shows a schematic top view of a fourth carbon nanotube composite structure in the third embodiment.

As shown in FIG. 8, the fourth carbon nanotube composite structure 40 consists of a plurality of single carbon nanotubes 12 and one film-like structure 14. The plurality of single carbon nanotubes 12 is parallel to each other and spaced apart from each other. Each single carbon nanotube 12 consists of one p-type portion and one n-type portion. The film-like structure 14 simultaneously covers the n-type portions of the plurality of single carbon nanotubes 12 and is in direct contact with the outer surfaces of the n-type portions.

Figure 9:
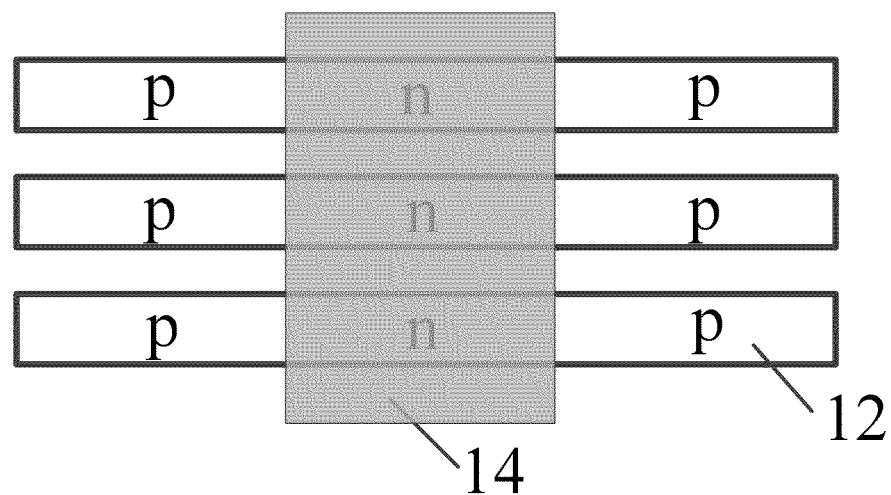
FIG. 9 shows a schematic top view of a fifth carbon nanotube composite structure in the third embodiment.

As shown in FIG. 9, the fifth carbon nanotube composite structure 50 consists of a plurality of single carbon nanotubes 12 and one film-like structure 14. The plurality of single carbon nanotubes 12 is parallel to each other and spaced apart from each other. Each single carbon nanotube 12 consists of a first p-type portion, a second p-type portion, and an n-type portion; and the n-type portion is between the first p-type portion and the second p-type portion. Each single carbon nanotube 12 is a p-n-p type carbon nanotube. The film-like structure 14 simultaneously covers the n-type portions of the plurality of single carbon nanotubes 12 and is in direct contact with the outer surfaces of the n-type portions.

Figure 10:
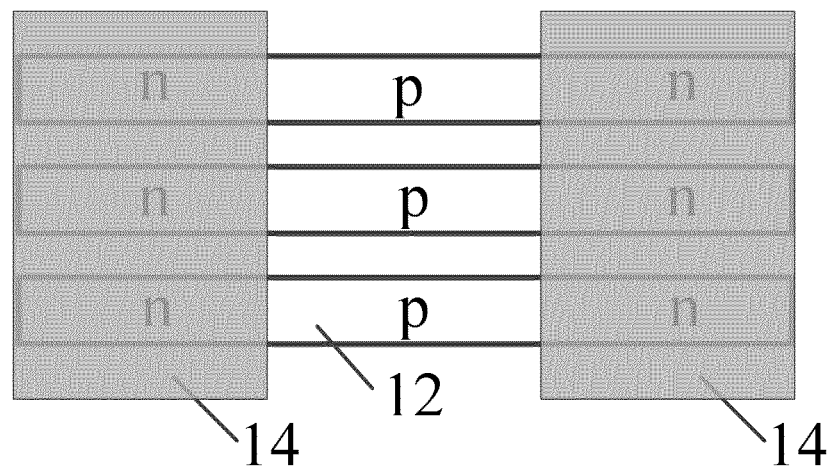
FIG. 10 shows a schematic top view of a sixth carbon nanotube composite structure in the third embodiment.

As shown in FIG. 10, the sixth carbon nanotube composite structure 60 consists of a plurality of single carbon nanotubes 12 and two film-like structures 14. The plurality of single carbon nanotubes 12 is parallel to each other and spaced apart from each other. Each single carbon nanotube 12 consists of a first n-type portion, a second n-type portion and a p-type portion; and the p-type portion is between the first n-type portion and the second n-type portion. Each single carbon nanotube 12 is an n-p-n type carbon nanotube. One film-like structure 14 simultaneously covers the first n-type portions of the plurality of single carbon nanotubes 12 and is in direct contact with the outer surfaces of the first n-type portions, and the other film-like structure 14 simultaneously covers the second n-type portions of the plurality of single carbon nanotubes 12 and is in direct contact with the outer surfaces of the second n-type portions.

Furthermore, the single carbon nanotube 12 in the carbon nanotube composite structure may also be of various types, such as n-p-n-p type, p-n-p-n type, and so on.

No matter how many n-type portion are in the single carbon nanotube 12, the outer surfaces of all the n-type portions are in direct contact with the film-like structure 14

It can be understood that the first carbon nanotube composite structure 10, the second carbon nanotube composite structure 20, and the third carbon nanotube composite structure 30 are prepared by the method in the first embodiment. The fourth carbon nanotube composite structure 40, the fifth carbon nanotube composite structure 50, and the sixth carbon nanotube composite structure 60 are prepared by the method in the second embodiment.

The carbon nanotube composite structure, such as the first carbon nanotube composite structure 10 to the sixth carbon nanotube composite structure 60, in the third embodiment has the following advantages: first, a portion of the single carbon nanotube 12 is p-type, and the other portion is n-type, and the single carbon nanotube 12 can consist of p-type and n-type; second, the single carbon nanotube 12 can be n-p-n, p-n-p, n-p-n-p, p-n-p-n, and other types; third, because the single carbon nanotube 12 contains p type and n-type, when the single carbon nanotube 12 is a semiconducting carbon nanotube, electrons can tunnel from the p-type valence band to the n-type conduction band, so that the band to band tunneling (BTBT) can be performed.

Figure 11:
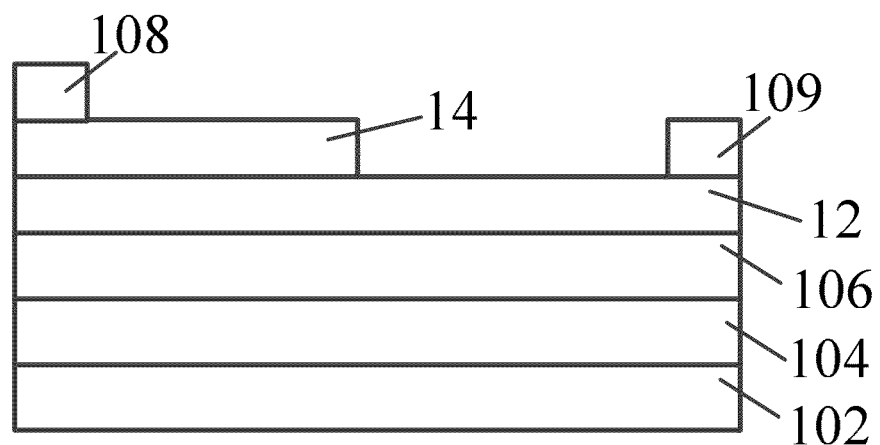
FIG. 11 shows a schematic section view of a back-gate tunneling transistor in a fourth embodiment according to the present disclosure.

Referring to FIG. 11, a back-gate tunneling transistor 100 in a fourth embodiment is provided. The back-gate tunneling transistor 100 includes a single carbon nanotube 12, a film-like structure 14, a source electrode 108, a drain electrode 109, an insulating layer 106, and a gate 104. The back-gate tunneling transistor 100 can be formed on a surface of an insulating substrate 102. The single carbon nanotube 12 is a semiconducting carbon nanotube. The film-like structure 14 is a molybdenum disulfide ($MoS_2$) film or a tungsten disulfide ($WS_2$) film, the material of the $MoS_2$ film is $MoS_2$, and the material of the $WS_2$ film is $WS_2$. In one embodiment, the back-gate tunneling transistor 100 consists of one single carbon nanotube 12, the film-like structure 14, the source electrode 108, the drain electrode 109, the insulating layer 106, and the gate 104.

The gate 104 is located on the surface of the insulating substrate 102, the insulating layer 106 is located on the surface of the gate 104 away from the insulating substrate 102, and the single carbon nanotube 12 is located on the surface of the insulating layer 106 away from the gate 104. The film-like structure 14 covers and is in direct contact with a portion of the single carbon nanotube 12, and the single carbon nanotube 12 is located between the insulating layer 106 and the film-like structure 14. The source electrode 108 is electrically connected to the film-like structure 14, and the drain electrode 109 is electrically connected to the single carbon nanotube 12. The insulating layer 106 is located between the source electrode 108 and the gate 104, and the insulating layer 106 is also located between the drain electrode 109 and the gate 104. In one embodiment, the source electrode 108 is in direct contact with the film-like structure 14, and the drain electrode 109 is in direct contact with the single carbon nanotube 12. Since the single carbon nanotube 12 is only one carbon nanotube and is one-dimensional, the film-like structure 14 is two-dimensional, a portion of the film-like structure 14 is in direct contact with the single carbon nanotube 12, and a portion of the film-like structure 14 is in direct contact with the insulating layer 106.

A portion of the single carbon nanotube 12 is located between the film-like structure 14 and the insulating layer 106, and this portion is in direct contact with both the film-like structure 14 and the insulating layer 106.

The insulating substrate 102 plays a supporting role, and the material of the insulating substrate 102 can be selected from hard materials such as glass, quartz, ceramics, diamond, silicon wafers, or flexible materials such as plastics and resins. In one embodiment, the material of the insulating substrate 102 is glass. The insulating substrate 102 can also be a substrate in a large-scale integrated circuit, and a plurality of back-gate tunneling transistors 100 can be integrated on the same insulating substrate 102 according to a predetermined rule or pattern.

The insulating layer 106 has an atomic level flat surface, and the material of the insulating layer 106 is boron nitride or the like. The thickness of the insulating layer 106 can be in a range from about 5 nanometers to about 100 microns. In one embodiment, the thickness of the insulating layer 106 is in a range from 5 nanometers to 100 microns, the material of the insulating layer 106 is hexagonal boron nitride; and the insulating layer 106 formed by the hexagonal boron nitride has an atomic level flat surface, the height difference between the highest place of the atomic level flat surface and the lowest place of the atomic level flat surface is atomic-scale, and the height difference between the highest place of the atomic level flat surface and the lowest place of the atomic level flat surface ranges in 1 atomic layer to 2 atomic layers.

The materials of the source electrode 108 and the drain electrode 109 should have good conductivity. The materials of the source electrode 108 and the drain electrode 109 can be metal, alloy, indium tin oxide (ITO), antimony tin oxide (ATO), conductive silver paste, conductive polymer, metallic carbon nanotube film, and so on. The thickness of each of the source electrode 108 and the drain electrode 109 can be in a range from 0.5 nanometers to 100 micrometers. In one embodiment, the source electrode 108 is an Au/Ti (gold/titanium, thickness is 50 nm/5 nm) electrode, and the Au/Ti electrode is formed by stacking a 50 nm thick gold layer and a 5 nm thick titanium layer; the 5 nm thick titanium layer is in direct contact with the film-like structure 14, the 50 nm thick Au layer is located on the surface of the titanium layer away from the film-like structure 14; and the material of the drain electrode 109 is palladium (Pd), and the thickness of the drain electrode 109 is 50 nm.

The material of the gate 104 has good conductivity. The material of the gate 104 can be conductive materials such as metal, alloy, ITO, ATO, conductive silver glue, conductive polymer, or carbon nanotube film. The metal or alloy material can be aluminum, copper, tungsten, molybdenum, gold or their alloys. The thickness of the gate 104 is in a range from about 0.5 nanometers to about 100 microns. In one embodiment, the thickness of the gate 104 is in a range from 0.5 nanometers to 100 microns, and the gate 104 is highly doped silicon.

A specific embodiment below is used to further illustrate the present application, but it should not be a limitation to the present application.

A highly doped silicon wafer (silicon is highly doped, thus the highly doped silicon is conductive and as the gate 104) has a 300 nm thick oxide layer (the material of the oxide layer is $SiO_2$). A hexagonal boron nitride (hBN) sheet (as the insulating layer 106) is transferred to the oxide layer by a transparent tape, the hBN sheet is in direct contact with the oxide layer, and the oxide layer is located between the highly doped silicon wafer and the hBN sheet. Since the hBN sheet has an atomic level flat surface, and the atomic level flat surface has no dangling bonds, the hBN sheet can shield charge doping from the $SiO_2$. The inner shell of a suspended semiconducting carbon nanotube is pulled out, and then the semiconducting carbon nanotube is placed on the hBN sheet by two tungsten tips. Only semiconducting carbon nanotubes are selected through electrical measurement. Since the inner shell of the semiconducting carbon nanotube is pulled out, the semiconducting carbon nanotube is a single-wall carbon nanotube or a double-wall carbon nanotube.

Under an optical microscope with a micromanipulator, a piece of $MoS_2$ film is placed on the semiconducting carbon nanotube, and the $MoS_2$ film covers only a portion of the semiconducting carbon nanotube. By using standard processes including electron beam lithography (EBL), electron beam evaporation and stripping, Pd (palladium, thickness is 50 nm) and Au/Ti (gold/titanium, 50 nm/5 nm) electrode are used to respectively connect to the semiconducting carbon nanotube and the $MoS_2$ film. Pd is electrically connected to the semiconducting carbon nanotube and serves as the drain electrode 109. The Au/Ti electrode is electrically connected to the $MoS_2$ film and serves as the source electrode 108. The semiconducting carbon nanotube serves as a channel layer. In this way, the preparation of the back-gate tunneling transistor 100 is completed, as shown in FIG. 12.

Figure 12:
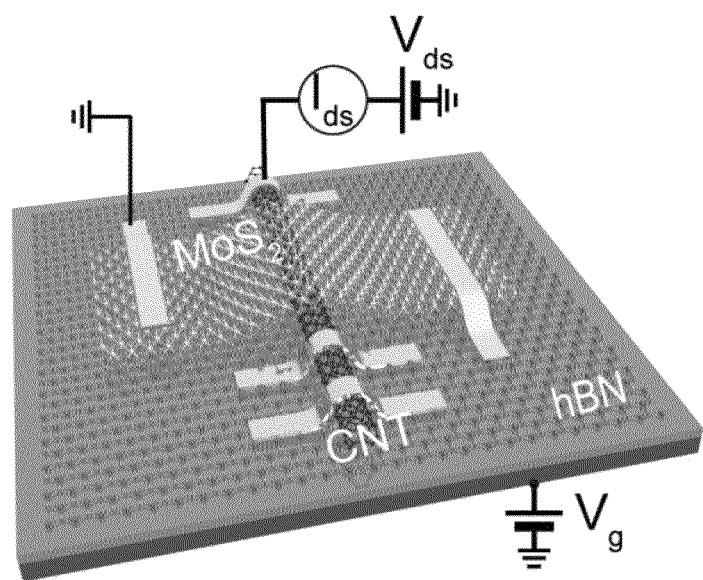
FIG. 12 shows a three-dimensional schematic view of the back-gate tunneling transistor in the fourth embodiment.

FIG. 12 shows a schematic view of the back-gate tunneling transistor 100 and an additional measurement circuit diagram. The main body is a mixed-dimensional heterojunction constructed or formed by the semiconducting carbon nanotube and the molybdenum disulfide, metal palladium is used as the contact electrode of the semiconducting carbon nanotube, and the Au/Ti electrode (the thickness of the Au is 50 nm, and the thickness of the Ti is 5 nm) as the contact electrode of molybdenum disulfide, to realize good p-type contact and n-type contact respectively. In FIG. 12, the two electrodes being in direct contact with molybdenum disulfide are all titanium-gold electrodes (Au/Ti electrode), and the three electrodes being in direct contact with the semiconducting carbon nanotubes are all palladium electrodes. It can be understood that, in FIG. 12, only one titanium-gold electrode (Au/Ti electrode) can be in direct contact with or electrically connected to molybdenum disulfide, and only a palladium electrode can be in direct contact with or electrically connected to the semiconducting carbon nanotubes. In the test, the heavily doped silicon substrate is the gate 104, the semiconducting carbon nanotube is in direct contact with the drain electrode 109, and the molybdenum disulfide is in direct contact with the source electrode 108.

The working principle of the back-gate tunneling transistor 100 is: the $MoS_2$ film or the $WS_2$ film covers and is in direct contact with a portion of the semiconducting carbon nanotube, and a portion of the semiconducting carbon nanotube directly contacting with the $MoS_2$ film or the $WS_2$ film is changed from p-type doping to n-type doping, so that one portion of the semiconducting carbon nanotube is p-type and the other portion of the semiconducting carbon nanotube is n-type. Therefore, the semiconducting carbon nanotube can form a p-n junction. Under a specific gate voltage, carriers can tunnel from the valence band of p-type carbon nanotube to the conduction band of n-type carbon nanotube, so that carriers can be transported from the drain electrode 109 to the source electrode 108 by the band-to-band tunneling. The gate 104 controls the tunneling current by controlling the number of carriers in the semiconducting carbon nanotube and $MoS_2$, so as to realize the switch conversion of the back-gate tunneling transistor 100.

FIGS. 13-29 are various performance characterizations of the back-gate tunneling transistor 100 of FIG. 12. In FIGS. 13-29, "CNT" represents the semiconducting carbon nanotube, "CNT with $MoS_2$" represents the semiconducting carbon nanotube whose middle portion is covered by the $MoS_2$ film (the middle portion of the semiconducting carbon nanotube covered by the $MoS_2$ film is the contact portion), "Before contact" represents the semiconducting carbon nanotube before directly contacting with the $MoS_2$ film, "After contact" represents the semiconducting carbon nanotube after directly contacting with the $MoS_2$ film, "overlapped region" represents the overlapping region of the $MoS_2$ film and the semiconducting carbon nanotube that is in direct contact with the $MoS_2$ film, "BTBT region" represents the inter-band tunneling region where the inter-band tunneling mechanism dominates the carrier transport within the corresponding gate voltage range, "Diffusion region" represents the region where the thermal diffusion mechanism dominates the carrier transport and diffusion within the corresponding gate voltage range, and "BTBT current" represents the band-to-band tunneling current.

Figure 13:
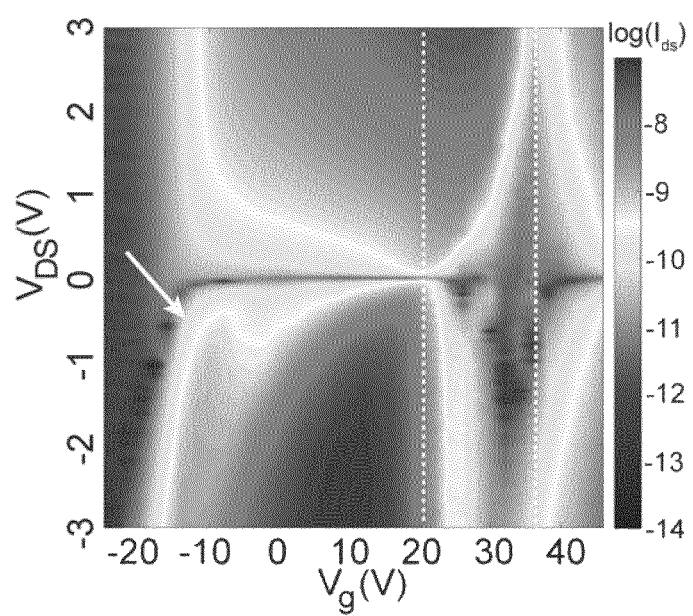
FIG. 13 shows a current scan view of the back-gate tunneling transistor in logarithmic form in the fourth embodiment.
Figure 14:
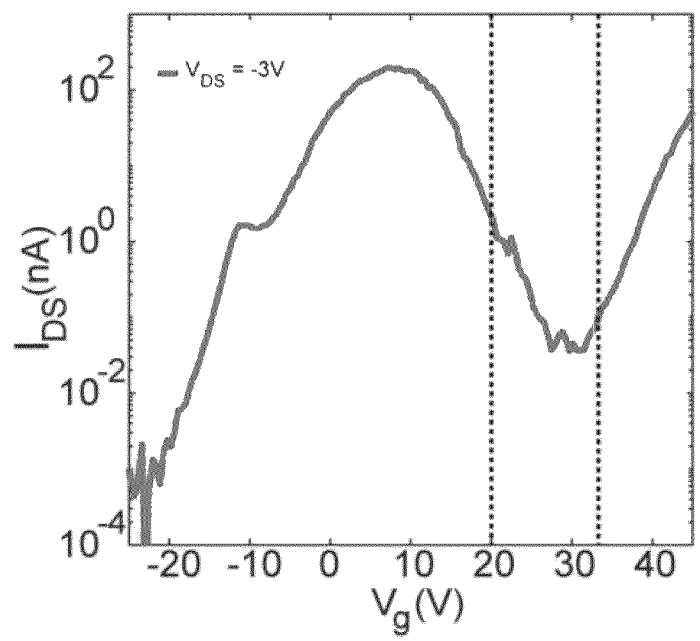
FIG. 14 shows a transfer characteristic curve of the back-gate tunneling transistor in the fourth embodiment.

FIG. 13 shows a current scan diagram of the back-gate tunneling transistor 100 in logarithmic form. In FIG. 13, the horizontal axis is the gate voltage (voltage of the gate 104), and the vertical axis is the source electrode-drain electrode bias voltage; the two dashed lines demarcate the operating modes of the back-gate tunneling transistor 100 under different gate voltages; from right to left are the nn junction area, the pn junction area, and the BTBT area. FIG. 14 shows a transfer characteristic curve of the back-gate tunneling transistor 100.

Figure 15:
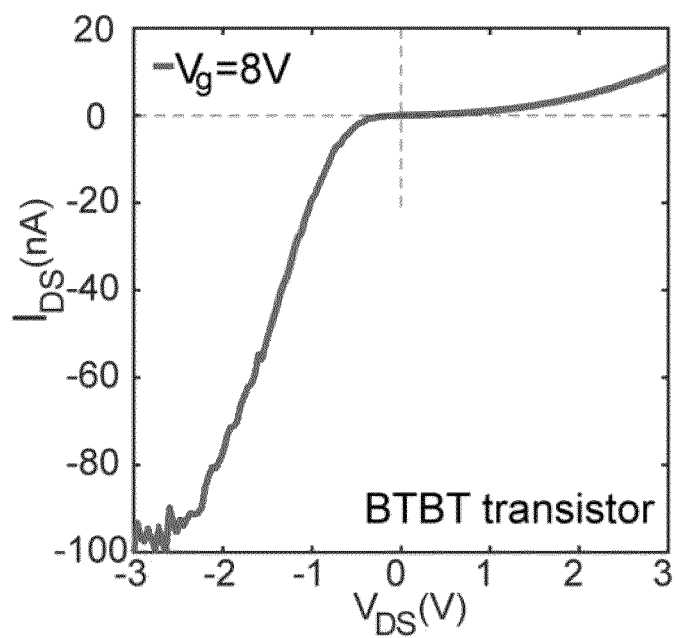
FIG. 15 shows a typical output characteristic curve of the back-gate tunneling transistor in a BTBT operating mode in the fourth embodiment.
Figure 16:
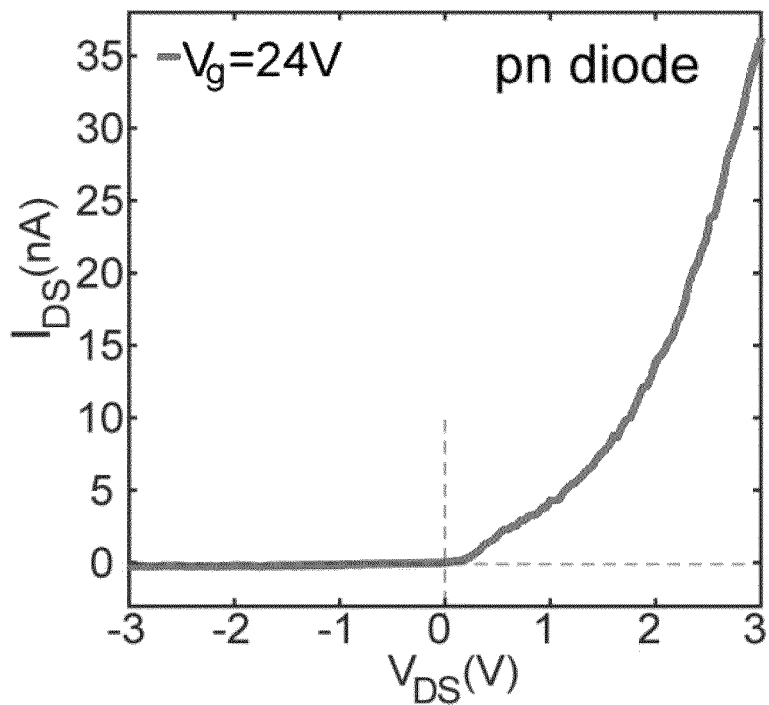
FIG. 16 shows a typical output characteristic curve of the back-gate tunneling transistor in a p-n junction operating mode in the fourth embodiment.
Figure 17:
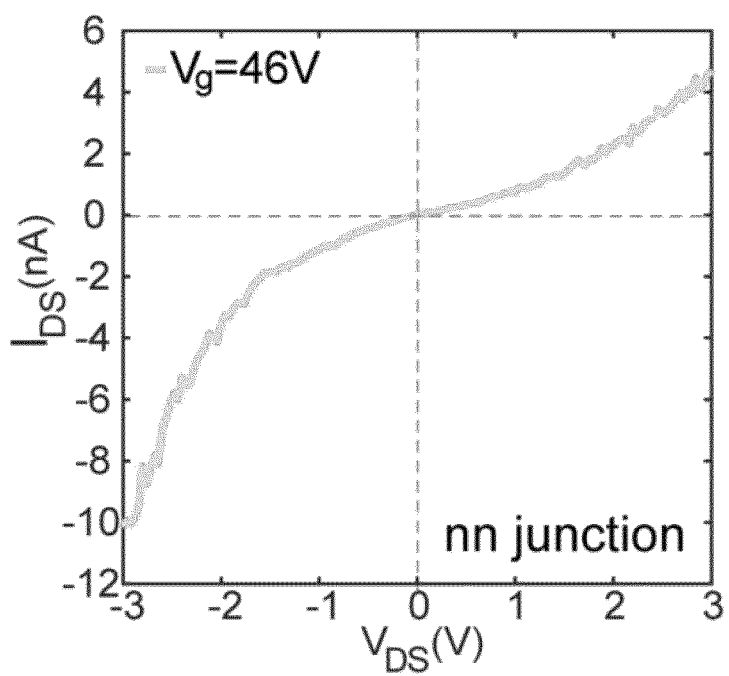
FIG. 17 shows a typical output characteristic curve of the back-gate tunneling transistor in the n-n junction operating mode in the fourth embodiment.

FIG. 15 shows a typical output characteristic curve of the back-gate tunneling transistor 100 in the BTBT operating mode. It can be seen from FIG. 15 that the reverse current is greater than the forward current. FIG. 16 shows a typical output characteristic curve of the back-gate tunneling transistor 100 in the pn junction operation mode, and FIG. 16 presents obvious forward rectification characteristics. FIG. 17 shows a typical output characteristic curve of the back-gate tunneling transistor 100 in the nn junction operation mode, and FIG. 17 presents positive and anti-symmetric output characteristics.

The pn junction working mode and the nn junction working mode refer to different working modes under the adjustment of the gate voltage. The gate voltage range corresponding to the nn junction working mode is approximately +35~+45V, the gate voltage range corresponding to the pn junction working mode is approximately +20V~+35V, and the gate voltage range corresponding to the BTBT working mode is approximately −20V~+20V.

Figure 18:
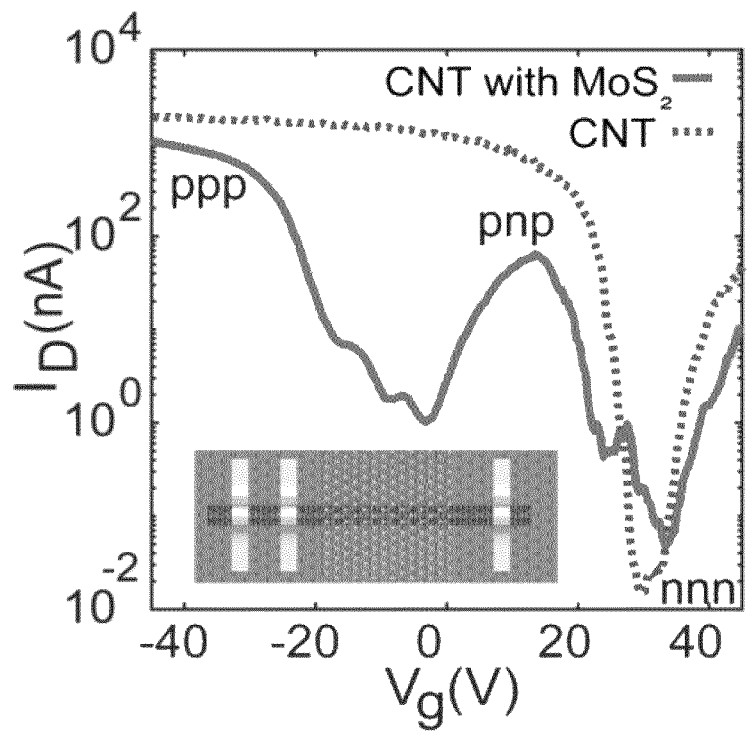
FIG. 18 shows transfer characteristic curves of the back-gate tunneling transistor and a carbon nanotube transistor in the fourth embodiment.

FIG. 18 shows a transfer characteristic curve of the back-gate tunneling transistor 100 and a transfer characteristic curve of a carbon nanotube transistor, wherein in the back-gate tunneling transistor 100, the $MoS_2$ film covers the middle portion of the semiconducting carbon nanotube. The only difference between the carbon nanotube transistor and the back-gate tunneling transistor 100 is that the carbon nanotube transistor does not contain the $MoS_2$ film, and the semiconducting carbon nanotubes are not covered by the $MoS_2$ film; and the back-gate tunneling transistor 100 contains the $MoS_2$ film, and the middle portion of the semiconducting carbon nanotube is covered by $MoS_2$ film.

It can be seen from FIG. 18 that the back-gate tunneling transistor 100 and the carbon nanotube transistor have a common switch off point at ~+35V (volt), and the transfer characteristic curve of the back-gate tunneling transistor 100 has an additional switch off point near −5V, which proves that the doping levels of the portion of the semiconducting carbon nanotubes covered by the $MoS_2$ film (that is, the contact portion) and the portion of the semiconducting carbon nanotubes not covered by $MoS_2$ film (that is, the exposed portion) are different.

Before the single carbon nanotube 12 is in contact with the $MoS_2$ film, the single carbon nanotube 12 is a one-dimensional p-type channel, the $MoS_2$ film is a two-dimensional n-type channel, and the Fermi energy level of the $MoS_2$ film is higher than that of the single carbon nanotube 12 that is not in direct contact with the $MoS_2$ film. When the single carbon nanotube 12 is in direct contact with the $MoS_2$ film, electrons can be spontaneously transferred from the $MoS_2$ film to the single carbon nanotube 12 until the Fermi energy levels of the single carbon nanotube 12 and the $MoS_2$ film are equal. Since electrons are spontaneously transferred from the $MoS_2$ film to the portion of the semiconducting carbon nanotubes being in direct contact with the $MoS_2$ film, the portion of the semiconducting carbon nanotube being in direct contact with the $MoS_2$ film is converted from p-type doping to n-type doping, and the portion of semiconducting carbon nanotubes that is not in direct contact with the $MoS_2$ film is still p-type.

Figure 19:
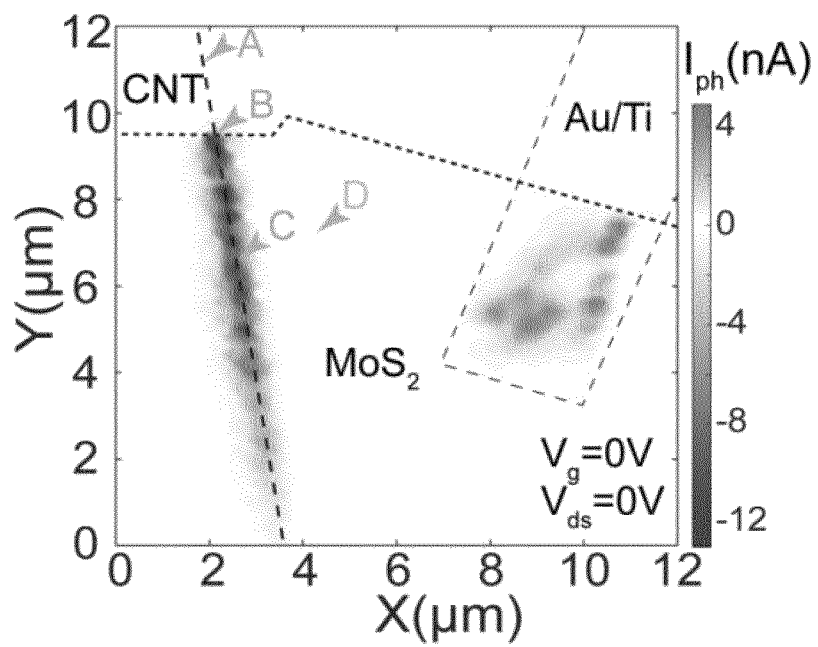
FIG. 19 shows a photocurrent view of the back-gate tunneling transistor in the fourth embodiment.

FIG. 19 is a photocurrent diagram of the back-gate tunneling transistor 100. FIG. 19 reflects that in the overlapping area between the $MoS_2$ film and the semiconducting carbon nanotube, the direction of the built-in electric field is from the $MoS_2$ film to the semiconducting carbon nanotube, which proves that electrons spontaneously transfer from the $MoS_2$ film to the semiconducting carbon nanotube.

Figure 20:
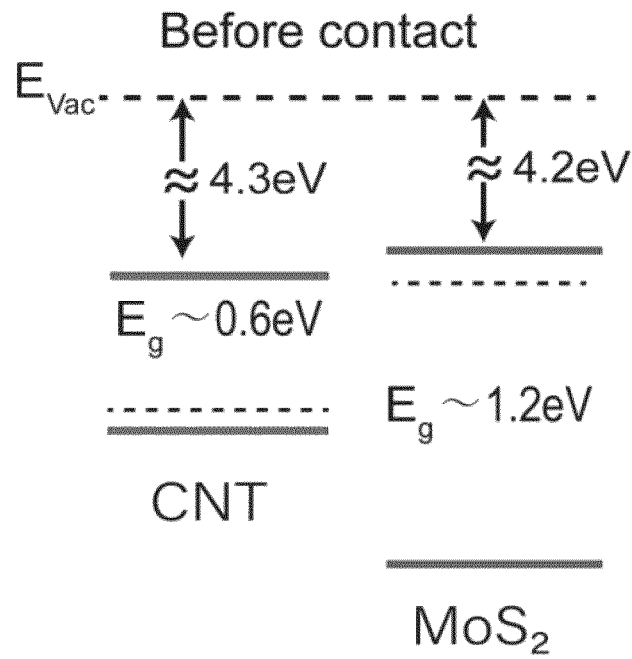
FIG. 20 shows an energy band view of a semiconducting carbon nanotube in the back-gate tunneling transistor before the semiconducting carbon nanotube is in direct contact with the $MoS_2$ film.
Figure 21:
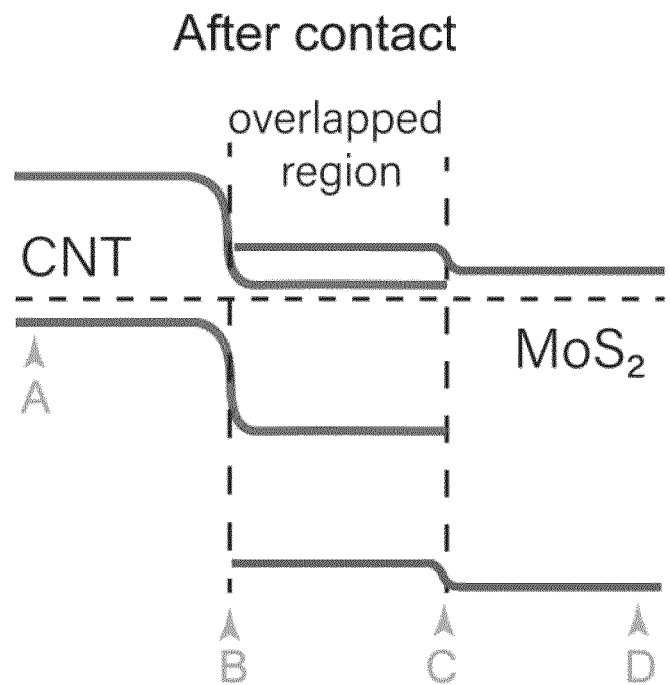
FIG. 21 shows an energy band view of the semiconducting carbon nanotube in the back-gate tunneling transistor after the semiconducting carbon nanotube is in direct contact with the $MoS_2$ film.

FIG. 20 shows an energy band view of the semiconducting carbon nanotube in the back-gate tunneling transistor before the semiconducting carbon nanotube is in direct contact with the $MoS_2$ film. FIG. 21 shows an energy band view of the semiconducting carbon nanotube in the back-gate tunneling transistor after the semiconducting carbon nanotube is in direct contact with the $MoS_2$ film. It can be seen from FIG. 21 that in the overlapping area between the $MoS_2$ film and the semiconducting carbon nanotube, the semiconducting carbon nanotube is changed from p-type doping to n-type doping.

Figure 22:
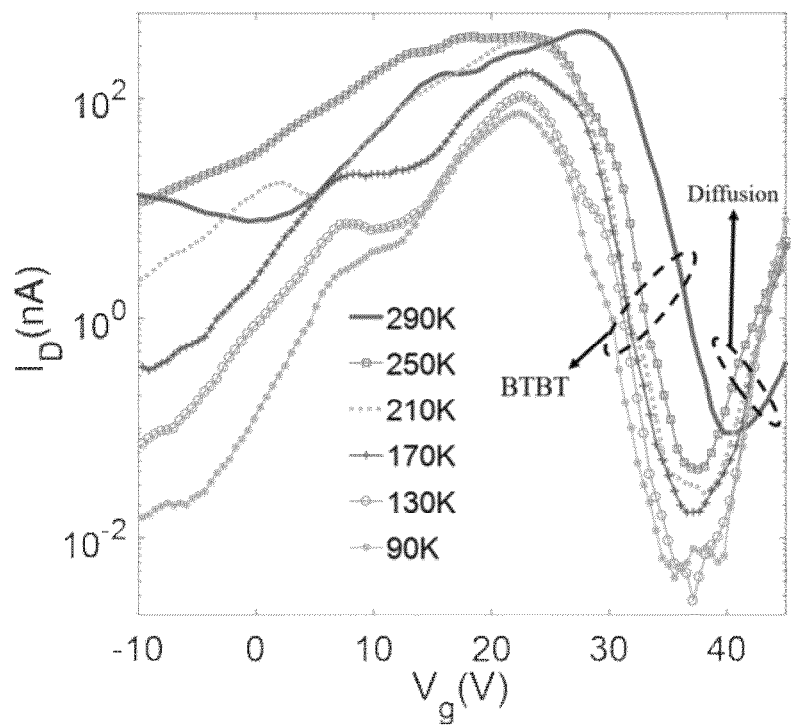
FIG. 22 shows transfer characteristic curves of the back-gate tunneling transistor at different temperatures.
Figure 23:
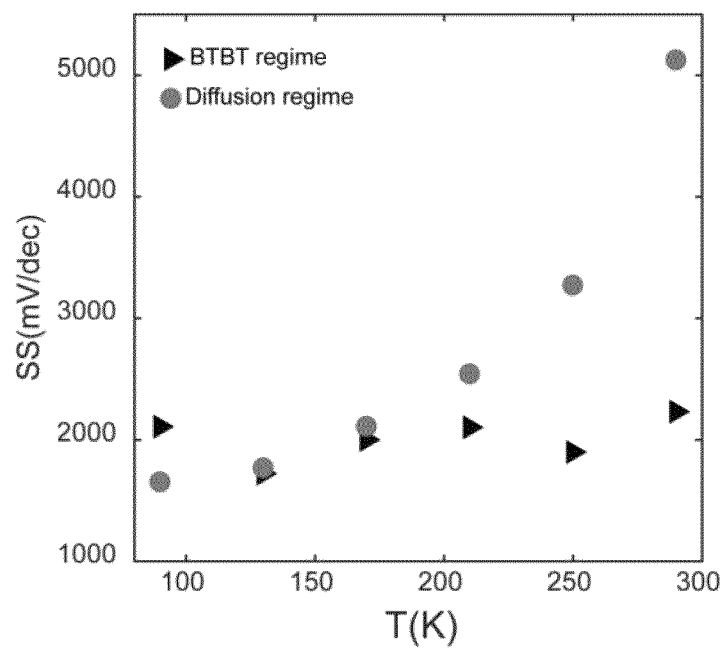
FIG. 23 shows sub-threshold swings in a diffusion area and a BTBT area extracted from FIG. 22.

FIG. 22 shows the transfer characteristic curves of the back-gate tunneling transistor 100 at different temperatures. FIG. 23 shows the sub-threshold swings in the diffusion area and the BTBT area extracted from FIG. 22. It can be seen from FIG. 23 that in the diffusion area, the sub-threshold swing decreases with the decrease of temperature; while in the BTBT area, the sub-threshold swing does not change with the decrease of temperature, which proves that the back-gate tunneling transistor 100 in the BTBT region works under the band-to-band tunneling mechanism.

Figure 24:
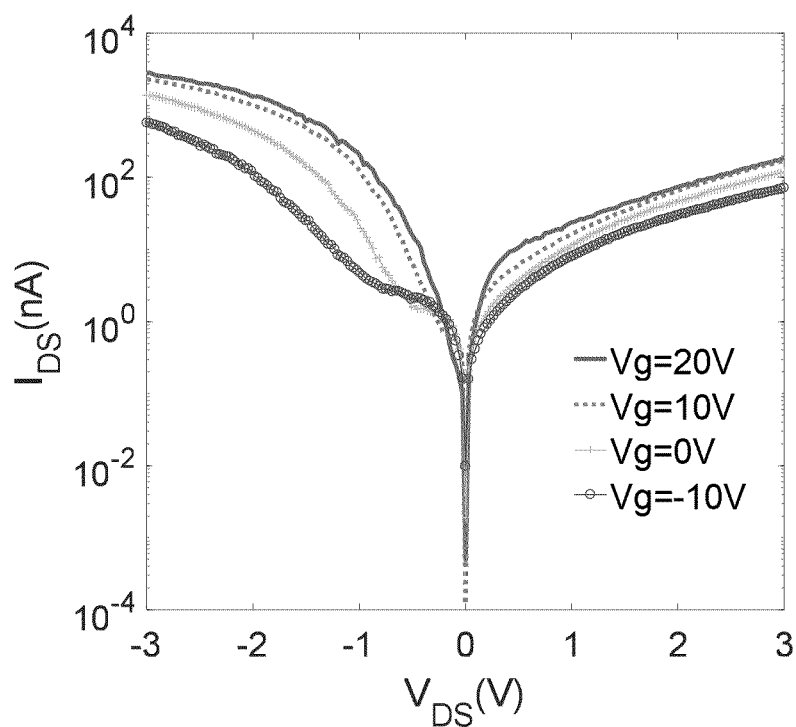
FIG. 24 shows a typical output curve of the $CNT-MoS_2$ heterostructure in the back-gate tunneling transistor under different gate voltages in the BTBT operating mode, wherein the typical output curve is drawn on a semi-logarithmic scale.
Figure 25:
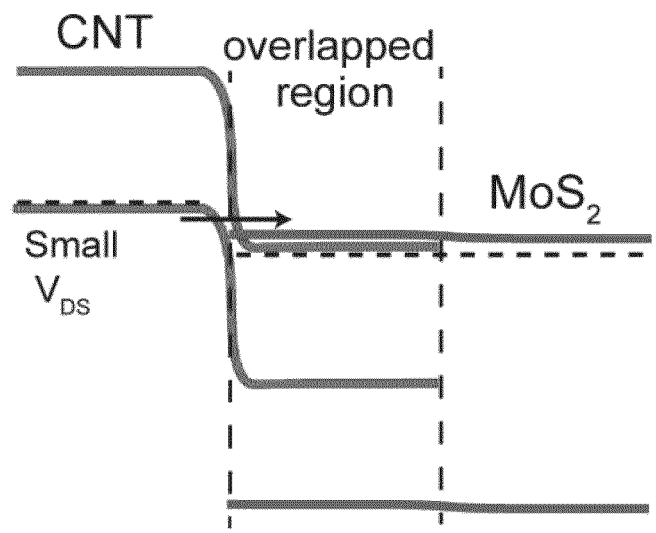
FIG. 25 shows an energy band view of a reverse rectifier diode in reverse bias.
Figure 26:
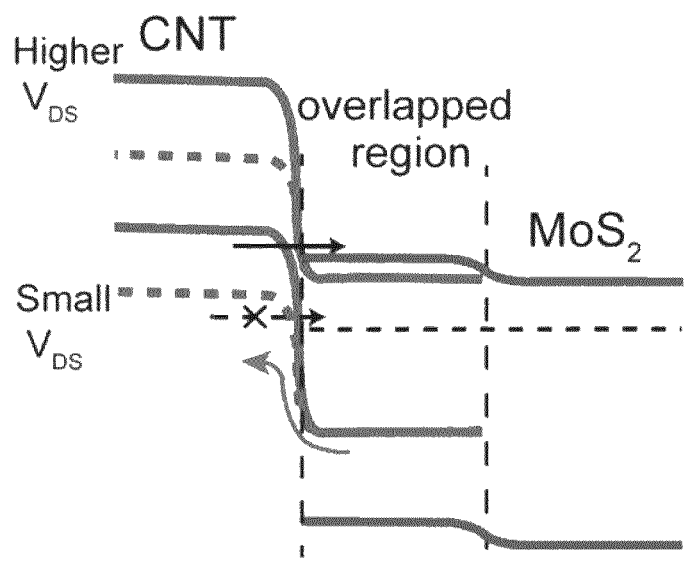
FIG. 26 shows an energy band view of a Zener diode under reverse bias.
Figure 27:
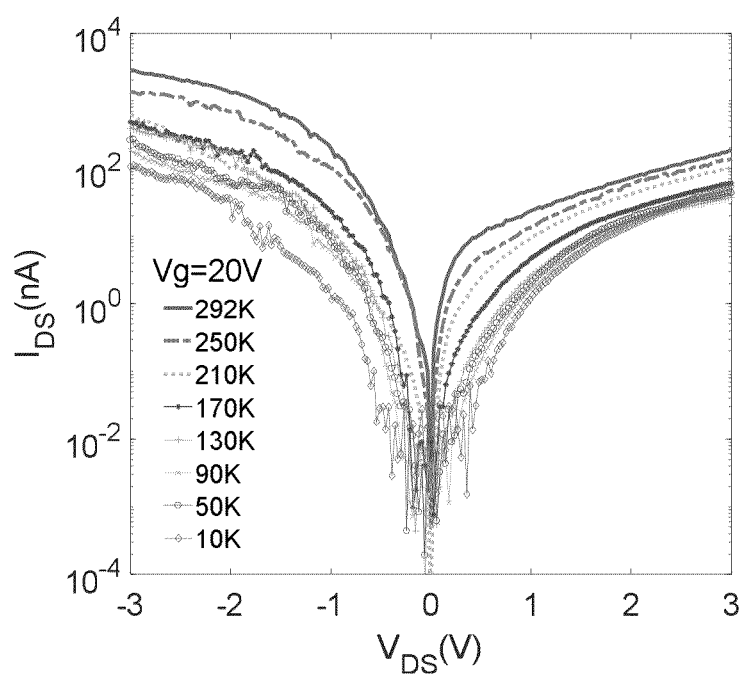
FIG. 27 shows the temperature-dependent output curves in a BTBT state when Vg=20V.
Figure 28:
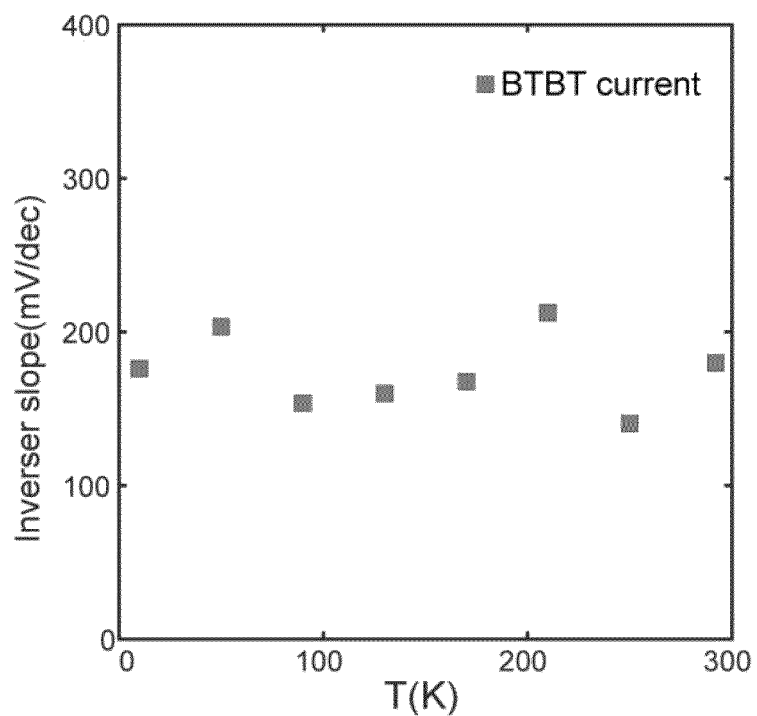
FIG. 28 shows inverse slopes of the band-to-band tunneling current (BTBT current) versus temperature when Vg=20V.
Figure 29:
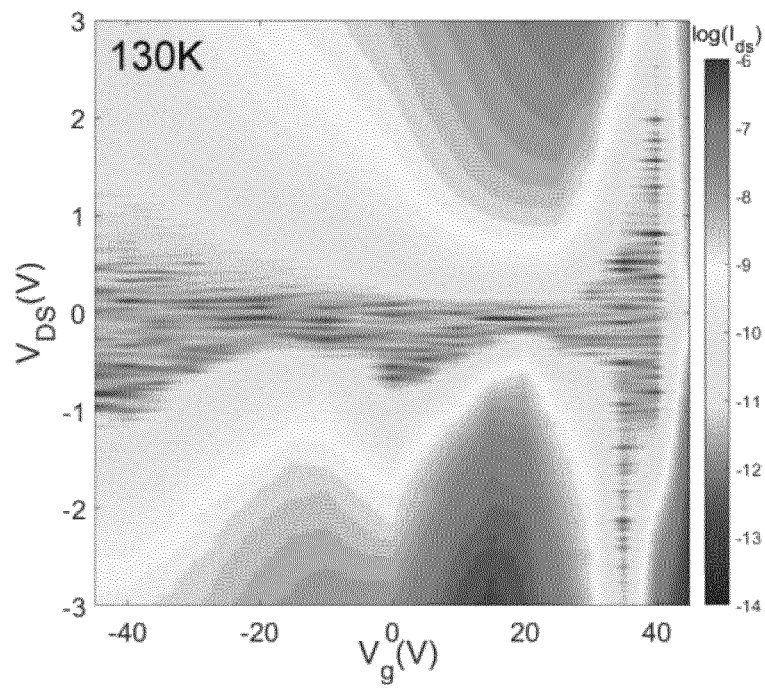
FIG. 29 shows mapping view of source electrode and drain electrode current I& at a temperature of 130K.

FIG. 24 shows a typical output curve of the $CNT-MoS_2$ heterostructure in the back-gate tunneling transistor 100 under different gate voltages in the BTBT operating mode, wherein the typical output curve is drawn on a semi-logarithmic scale. FIG. 25 shows an energy band view of a reverse rectifier diode in reverse bias. FIG. 26 shows an energy band view of a Zener diode under reverse bias. The working mechanisms of the reverse rectifier diode and the Zener diode are both band-to-band tunneling (BTBT). The difference is that the reverse rectifier diode will have a reverse current under a small reverse voltage; for the Zener diode, only after the reverse voltage reaches a certain value, the reverse current can be turned on. FIG. 27 shows the temperature-dependent output curves in the BTBT state when Vg=20V. FIG. 28 shows inverse slopes of the band-to-band tunneling current (BTBT current) versus temperature when Vg=20V. FIG. 29 shows a mapping diagram of the current Ids of the source electrode 108 and the drain electrode 109 at a temperature of 130K. It can be seen from FIG. 29 that the shoulder peak and the main peak are clearly separated. FIGS. 24 to 29 are analysis of the output characteristics of the BTBT area.

The fourth embodiment further provides a comparative experiment between a metallic carbon nanotube field effect transistor (the middle portion of the metallic carbon nanotube is covered and in direct contact with the $MoS_2$ film) and a pure metallic carbon nanotube field effect transistor to verify that the $MoS_2$ film also performs n-type doping to the metallic carbon nanotube. The only difference between the metallic carbon nanotube field effect transistor and the back-gate tunneling transistor 100 is: in the metallic carbon nanotube field effect transistor, the metallic carbon nanotube serves as the channel layer; in the back-gate tunneling transistor 100, the semiconducting carbon nanotube serves as the channel layer. The only difference between the pure metallic carbon nanotube field effect transistor and the metallic carbon nanotube field effect transistor is that in the pure metallic carbon nanotube field effect transistor, the metallic carbon nanotube serves as the channel layer and does not covered by the $MoS_2$ film and is not in direct contact with the $MoS_2$ film; in the metallic carbon nanotube field effect transistor, one portion of the metallic carbon nanotube used as the channel layer, such as the middle portion of the metallic carbon nanotube, is covered by the $MoS_2$ film and is in direct contact with the $MoS_2$ film.

Figure 30:
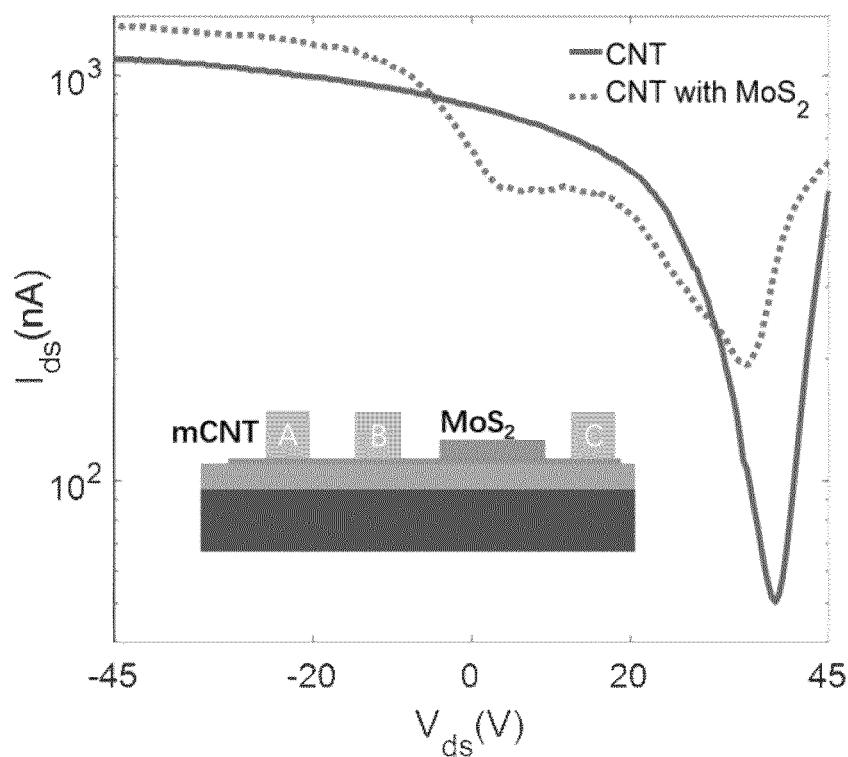
FIG. 30 shows transfer characteristic curves of a pure metallic carbon nanotube field effect transistor and a metallic carbon nanotube field effect transistor having the $MoS_2$ film.

FIG. 30 shows transfer characteristic curves of the pure metallic carbon nanotube field effect transistor and the metallic carbon nanotube field effect transistor having the $MoS_2$ film. In FIG. 30, "mCNT" represents the metallic carbon nanotube. It can be seen from FIG. 30 that an extra Dirac point appears in the transfer characteristic curve of the metallic carbon nanotube that is covered by the $MoS_2$ film and in direct contact with the $MoS_2$ film, as indicated by the arrow of FIG. 30, due to electron doping to the portion of the metallic carbon nanotube being in direct contact with the $MoS_2$ film. It can be proved that the metallic carbon nanotube is also doped n-type by the $MoS_2$ film, the portion of the metallic carbon nanotube that is in direct contact with the $MoS_2$ film is changed from p-type doping to n-type doping, and the portion of the metallic carbon nanotube that is not in direct contact with the $MoS_2$ film is still p-type.

Figure 31:
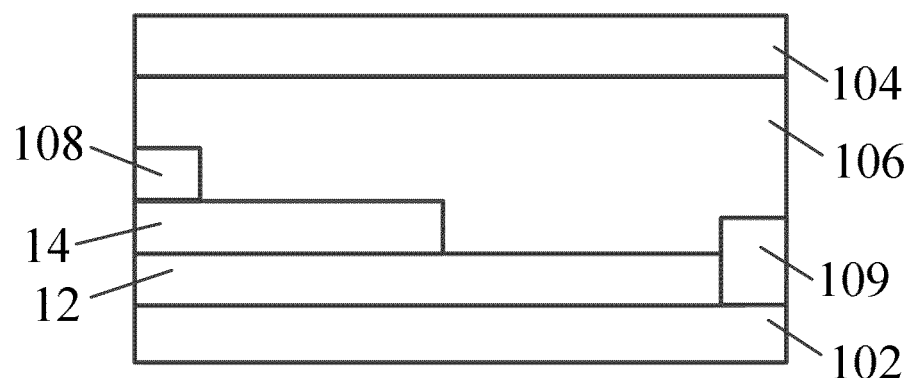
FIG. 31 shows a schematic view of a top-gate tunneling transistor in a fifth embodiment according to the present disclosure.

Referring to FIG. 31, a top-gate tunneling transistor 200 of a fifth embodiment is provided. The top-gate tunneling transistor 200 includes the single carbon nanotube 12, the film-like structure 14, the source electrode 108, the drain electrode 109, the insulating layer 106, and the gate 104. The top-gate tunneling transistor 200 may be formed on a surface of the insulating substrate 102. The single carbon nanotube 12 is a semiconducting carbon nanotube. In one embodiment, the top-gate tunneling transistor 200 consists of the single carbon nanotube 12, the film-like structure 14, the source electrode 108, the drain electrode 109, the insulating layer 106, and the gate 104.

The single carbon nanotube 12 is located on the surface of the insulating substrate 102, and the film-like structure 14 covers a portion of the single carbon nanotube 12 and is in direct contact with the outer surface of this portion. Since the single carbon nanotube 12 is one-dimensional and the film-like structure 14 is two-dimensional, a portion of the film-like structure 14 is in direct contact with a portion of the single carbon nanotube 12, and another portion of the film-like structure 14 is in direct contact with the insulating substrate 102. The drain electrode 109 is electrically connected to the single carbon nanotube 12, and the source electrode 108 is electrically connected to the film-like structure 14. The insulating layer 106 covers the source electrode 108, the film-like structure 14, the single carbon nanotube 12, and the drain electrode 109. The gate 104 is located on the surface of the insulating layer 106 away from the insulating substrate 102. The insulating layer 106 electrically insulates the source electrode 108, the film-like structure 14, the single carbon nanotube 12, and the drain electrode 109 from the gate 104.

It can be understood that, depending on the specific forming process, the insulating layer 106 does not need to completely cover the source electrode 108, the film-like structure 14, the single carbon nanotube 12, and the drain electrode 109, as long as it can be ensured that the gate electrode 104 is insulated from each of the source electrode 108, the film-like structure 14, the single carbon nanotube 12, and the drain electrode 109.

The top-gate tunneling transistor 200 in the fifth embodiment is similar to the back-gate tunneling transistor 100 in the fourth embodiment, except that the former is a top-gate type, and the latter is a back-gate type. The structures, materials and dimensions of the single carbon nanotube 12, the film-like structure 14, the source electrode 108, the drain electrode 109, the insulating layer 106, and the gate 104 in the fifth embodiment are the same as those in the fourth embodiment.

The back-gate tunneling transistor 100 in the fourth embodiment and the top-gate tunneling transistor 200 in the fifth embodiment have the following advantages: first, the single semiconducting carbon nanotube contains p-type and n-type, and electrons can be tunneled from p-type doping to n-type doping to achieve band to band tunneling (BTBT); second, one-dimensional single semiconducting carbon nanotube and two-dimensional $MoS_2$ film (or $WS_2$ film) combine to have excellent controllability of the gate 104; third, the ideal interface with strong coupling between the unique single semiconducting carbon nanotube and the two-dimensional $MoS_2$ film (or $WS_2$ film) can increase the on-current and reduce the sub-threshold swing; fourth, since the surface of the insulating layer 106 is the atomic level flat surface without dangling bonds, so that the insulating layer 106 can shield the charge doping from the surface of the gate 104.

Figure 32:
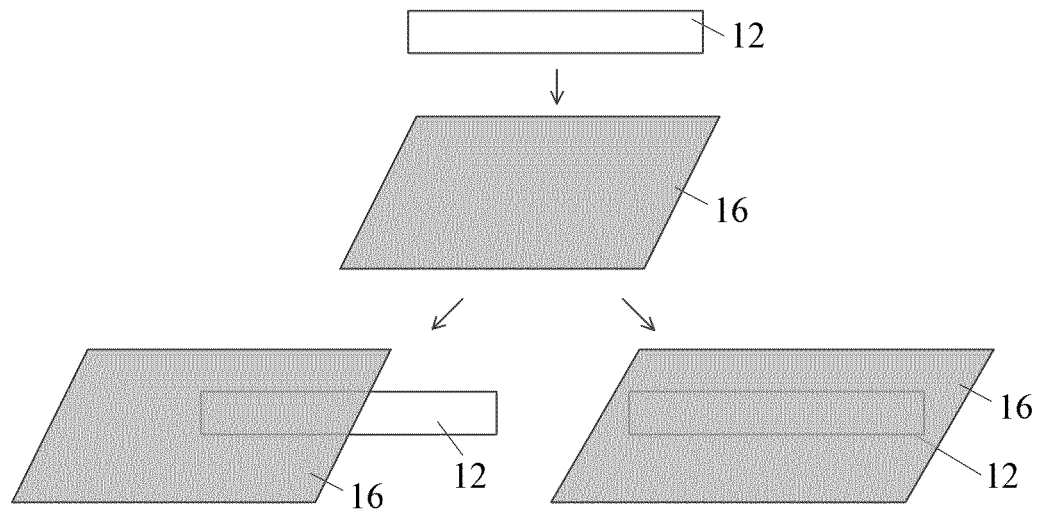
FIG. 32 shows a schematic process flow of a method of p-type doping a carbon nanotube in a sixth embodiment according to the present disclosure.

Referring to FIG. 32, a method of p-type doping carbon nanotubes in a sixth embodiment is provided, and the method includes the following steps:

S61, providing a single carbon nanotube 12;

S62, providing a layered structure 16, wherein the layered structure 16 is a tungsten diselenide ($WSe_2$) film or a black phosphorus (BP) film; and S63, making the layered structure 16 in direct contact with at least one portion of the single carbon nanotube 12.

During step S62, the tungsten diselenide ($WSe_2$) film or the black phosphorus (BP) film is a two-dimensional film. The material of the $WSe_2$ film is $WSe_2$, and the material of the black phosphorus film is black phosphorus.

Figure 33:
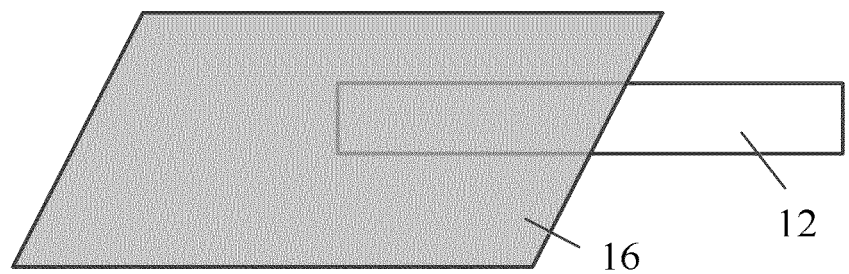
FIG. 33 shows a schematic view of a tungsten diselenide ($WSe_2$) film or a black phosphorus (BP) film covering and being in direct contact with a portion of a single carbon nanotube in the sixth embodiment.
Figure 34:
FIG. 34 shows a schematic view of the tungsten diselenide ($WSe_2$) film or the black phosphorus (BP) film covering and being in direct contact with entire single carbon nanotube in the sixth embodiment.

During step S63, the single carbon nanotube 12 may be completely covered by the layered structure 16 or partly covered by the layered structure 16. The layered structure 16 can cover and be in direct contact with a portion of the single carbon nanotube 12, while another portion of the single carbon nanotube 12 is exposed and is not in direct contact with the layered structure 16. The layered structure 16 can also cover and be in direct contact with the entire single carbon nanotube 12. All the carbon nanotubes covered by the layered structure 16 are in direct contact with the layered structure 16. As shown in FIG. 33, the layered structure 16 covers and is in direct contact a portion of the single carbon nanotube 12. As shown in FIG. 34, the layered structure 16 covers and is in direct contact the entire upper surface of the single carbon nanotube 12.

The portion of the single carbon nanotube 12 that is in direct contact with the layered structure 16 is defined as the contact portion, and the part of the single carbon nanotube 12 that is not in direct contact with the layered structure 16 is defined as the exposed portion. The single carbon nanotube 12 can consist of the contact portion and the exposed portion.

The carbon nanotube itself is p-type, but in practical applications, it is still necessary to p-doping to carbon nanotube that is p-type. The layered structure 16 is in direct contact the contact portion, $WSe_2$ or black phosphorus contributes holes to the contact portion, and holes enter the contact portion from $WSe_2$ or black phosphorus, so that the contact portion is p-doped. In one embodiment, holes only enter the contact portion from $WSe_2$ or black phosphorus, so that only contact portion is p-type doped by covering the contact portion with the layered structure 16, and the exposed portion is not p-type doped by covering the contact portion with the layered structure 16. At this time, the exposed portion of the single carbon nanotube 12 is still p-type, because the carbon nanotube itself is p-type. The entire single carbon nanotube 12 is p-type.

The method of p-type doping the carbon nanotube in the sixth embodiment is similar to the method of n-type doping the carbon nanotube in the first embodiment except that: in the first embodiment, the film-like structure 14 covers and is in direct contact with at least one portion of the carbon nanotube 12, and the material of the film-like structure 14 is molybdenum disulfide or tungsten disulfide, so that the at least one portion of the carbon nanotubes covered by the film-like structure 14 is n-type doped, which is changed from p-type doping to n-type doping, and the at least one portion of the single carbon nanotube 12 is n-type; in the sixth embodiment, the layered structure 16 covers and is in direct contact with at least one portion of the single carbon nanotube 12, and the material of the layered structure 16 is tungsten diselenide or black phosphorus, so that the at least one portion of the carbon nanotubes covered by the layered structure 16 is p-type doped, and the single carbon nanotube 12 is p-type as a whole. The type and size of the single carbon nanotube 12 and the size of the layered structure 16 in the sixth embodiment are the same as the type and size of the single carbon nanotube 12 and the size of the film-like structure 14 in the first embodiment.

The sixth embodiment further provides a comparative experiment between a carbon nanotube field effect transistor having a $WSe_2$ film and a pure carbon nanotube field effect transistor without having the $WSe_2$ film to verify that the $WSe_2$ film can p-type dope to the carbon nanotube. The only difference between the pure carbon nanotube field effect transistor and the carbon nanotube field effect transistor having the $WSe_2$ film is: the pure carbon nanotube field effect transistor does not include the $WSe_2$ film, and the carbon nanotube of the pure carbon nanotube field effect transistor is not covered by the $WSe_2$ film and is not in direct contact with the $WSe_2$ film; in the carbon nanotube field effect transistor having the $WSe_2$ film, a portion of the carbon nanotube is covered by the $WSe_2$ film and is in direct contact with the $WSe_2$ film.

Figure 35:
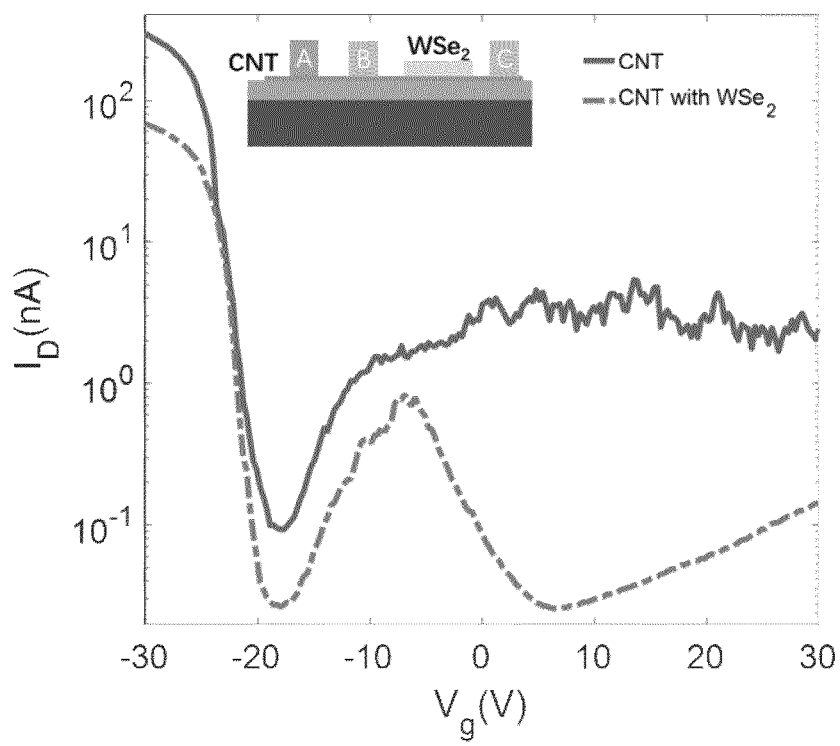
FIG. 35 shows transfer characteristic curves of a carbon nanotube field effect transistor having the WSe$_2$ film and a pure carbon nanotube field effect transistor.

FIG. 35 shows transfer characteristic curves of the carbon nanotube field effect transistor having the $WSe_2$ film and the pure carbon nanotube field effect transistor without having the WSe$_2$ film. It can be seen from FIG. 35 that the carbon nanotube field effect transistor having the WSe$_2$ film and the pure carbon nanotube field effect transistor without having the WSe$_2$ film have a common switch off point at ~−18V, and the transfer characteristic curve of the carbon nanotube field effect transistor having the WSe$_2$ film has an additional switch off point near +5V, which proves that the doping levels of the semiconducting carbon nanotubes covered by WSe$_2$ film and the semiconducting carbon nanotubes not covered by WSe$_2$ film are different.

Before the single carbon nanotube is in direct contact with the WSe$_2$ film, the single carbon nanotube is a one-dimensional bipolar channel dominated by p-type, and the WSe$_2$ film is a two-dimensional p-type channel. After the single carbon nanotube is in direct contact with the WSe$_2$ film, holes spontaneously transfer from the WSe$_2$ film to the portion of the semiconducting carbon nanotube that is covered by the WSe$_2$ film and is in direct contact with the WSe$_2$ film. Therefore, when the portion of the carbon nanotube not covered by WSe$_2$ film changes from p-type doping to n-type doping under the adjustment of the gate voltage, the carbon nanotube covered by WSe$_2$ film still remains p-type. When the holes in WSe$_2$ film are depleted, the portion of carbon nanotube covered by WSe$_2$ film changes from p-type doping to n-type doping, to form a second switch off point. It can be proved that the portion of the carbon nanotube that is covered by the WSe$_2$ film and is in direct contact with the WSe$_2$ film is P-type doped, and the portion of the carbon nanotube that is not covered by the WSe$_2$ film and is not in direct contact with the WSe$_2$ film is not P-type doped.

Figure 36:
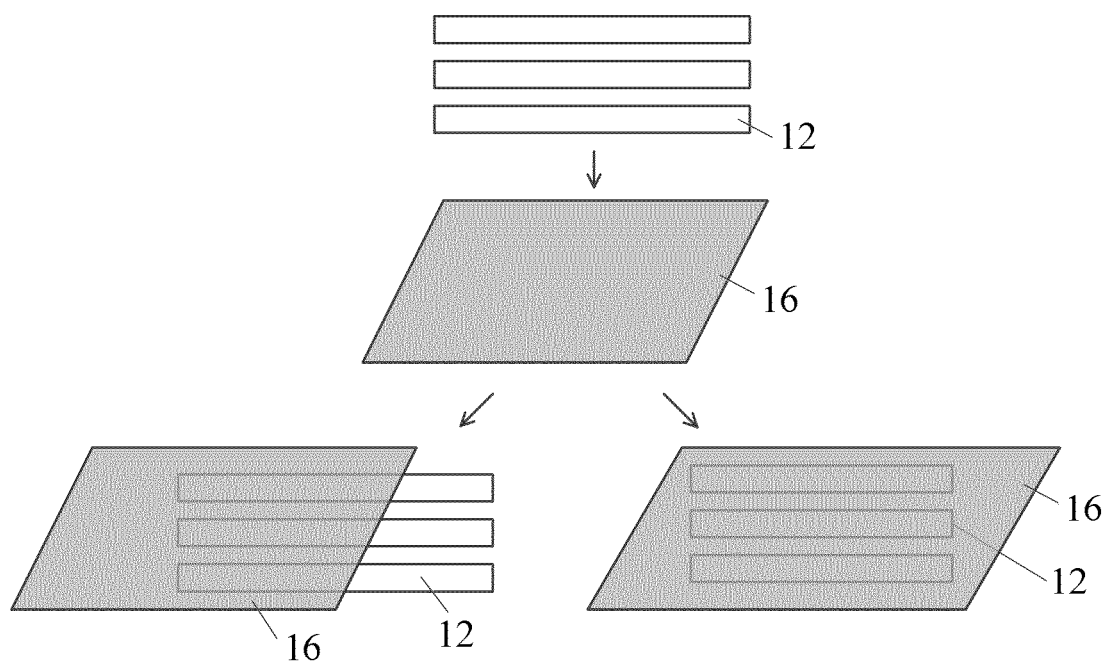
FIG. 36 shows a schematic process flow of a method of p-type doping carbon nanotubes in a seventh embodiment according to the present disclosure.

Referring to FIG. 36, a method of p-type doping carbon nanotubes in a seventh embodiment is provided, and the method includes the following steps:

S71, providing a plurality of single carbon nanotubes 12 spaced apart from each other;

S72, providing the layered structure 16, and the layered structure 16 is the tungsten diselenide (WSe$_2$) film or the black phosphorus (BP) film; and S73, covering the plurality of single carbon nanotubes 12 with the layered structure 16, wherein at least one portion of each of the plurality of single carbon nanotubes 12 is in direct contact with the layered structure 16.

The method of p-type doping carbon nanotubes in the seventh embodiment is similar to the method of p-type doping the carbon nanotube in the sixth embodiment, except that: in the sixth embodiment, the tungsten diselenide (WSe$_2$) Film or the black phosphorous (BP) film covers at least one portion of one single carbon nanotube 12; in the seventh embodiment, the tungsten diselenide (WSe$_2$) film or the black phosphorous (BP) film simultaneously covers at least one portion of each of the plurality of carbon nanotubes 12.

During step S71, in one embodiment, the length extending directions of the plurality of single carbon nanotubes 12 are parallel to each other.

During step S73, the tungsten diselenide (WSe$_2$) film or the black phosphorus (BP) film can simultaneously cover a portion of each of the plurality of single carbon nanotubes 12, so that a portion of each single carbon nanotube 12 is p-type Doped. The tungsten diselenide (WSe$_2$) film or the black phosphorus (BP) film can cover an entirety of the multiple single carbon nanotubes 12, so that an entirety of each single carbon nanotube 12 is fully p-type doped.

The methods for p-type doping carbon nanotubes in the sixth and seventh embodiments have the following advantages: first, the tungsten diselenide (WSe$_2$) film or the black phosphorus (BP) film is in direct contact at least one portion of a single carbon nanotube 12, so that the at least one portion of the single carbon nanotube 12 can be p-doped; second, the tungsten diselenide (WSe$_2$) film or the black phosphorus (BP) film can cover an entirety of the multiple single carbon nanotubes 12, so that the multiple single carbon nanotubes 12 can be p-doped at the same time; third, the method is simple, and the p-type doping effect is good.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method of n-type doping a carbon nanotube, comprising:
   providing a single carbon nanotube:
   providing a film-like structure, wherein the film-like structure is a molybdenum disulfide film or a tungsten disulfide film; and
   converting at least one portion of the carbon nanotube from a p-type doping to an n-type doping by covering the carbon nanotube with the film-like structure.

2. The method of claim 1, wherein a material of the molybdenum disulfide film is molybdenum disulfide, and a material of the tungsten disulfide film is tungsten disulfide.

3. The method of claim 1, wherein the carbon nanotube is a single-walled carbon nanotube or a double-walled carbon nanotube.

4. The method of claim 1, wherein one portion of the carbon nanotube that is in direct contact with the film-like structure is defined as a contact portion, and the contact portion is changed from p-type doping to n-type doping.

5. The method of claim 1, wherein one portion of the carbon nanotube that is in direct contact with the film-like structure is changed from p-type doping to n-type doping, and the other portion of the carbon nanotube that is not in direct contact with the film-like structure is p-type.

6. The method of claim 1, wherein an entirety of the carbon nanotube is in direct contact with the film-like structure, so that the entirety of the carbon nanotube is changed from p-type doping to n-type doping.

7. The method of claim 1, wherein controlling an amount of n-type doping of the carbon nanotube by adjusting a portion of the carbon nanotube which is covered with the film-like structure.

8. A method of n-type doping a carbon nanotube, comprising:
   providing a plurality of carbon nanotubes spaced apart from each other;
   providing a film-like structure, wherein the film-like structure is a molybdenum disulfide film or a tungsten disulfide film, and covering the plurality of carbon nanotubes with the film-like structure, wherein the plurality of carbon nanotubes is in direct contact with the film-like structure.

9. The method of claim 8, wherein length extending directions of the plurality of carbon nanotubes are parallel to each other.

10. The method of claim 8, wherein at least one portion of each of the plurality of carbon nanotubes is in direct contact with the film-like structure.

11. The method of claim 8, wherein a material of the molybdenum disulfide film is molybdenum disulfide, and a material of the tungsten disulfide film is tungsten disulfide.

12. The method of claim 8, wherein at least one portion of each of the plurality of the carbon nanotubes that is in direct contact with the film-like structure is changed from p-type doping to n-type doping.

13. The method of claim 12, wherein one portion of the plurality of carbon nanotubes that is not in direct contact with the film-like structure is p-type.

14. The method of claim 8, wherein an entirety of the plurality of carbon nanotubes is in direct contact with the film-like structure, so that an entirety of each of the plurality of carbon nanotubes is changed from p-type doping to n-type doping.

15. A method of n-type doping a carbon nanotube, comprising:
providing a plurality of carbon nanotubes spaced apart from each other;
providing a film-like structure, wherein the film-like structure is a molybdenum disulfide film or a tungsten disulfide film; and
covering the plurality of carbon nanotubes with the film-like structure.

16. The method of claim 15, wherein length extending directions of the plurality of carbon nanotubes are parallel to each other.

17. The method of claim 15, wherein one portion of each of the plurality of carbon nanotubes is in direct contact with the film-like structure, and the other portion of each of the plurality of carbon nanotubes is not in direct contact with the film-like structure.

18. The method of claim 15, wherein a material of the molybdenum disulfide film is molybdenum disulfide, and a material of the tungsten disulfide film is tungsten disulfide.

19. The method of claim 15, wherein controlling an amount of n-type doping of the plurality of carbon nanotubes by adjusting a portion of the plurality of carbon nanotubes which is covered with the film-like structure.

* * * * *